United States Patent [19]

Maiorca et al.

[11] Patent Number: 5,110,615
[45] Date of Patent: May 5, 1992

[54] METHOD FOR DISPENSING VISCOUS MATERIALS A CONSTANT HEIGHT ABOVE A WORKPIECE SURFACE

[75] Inventors: Philip P. Maiorca, Poway; Ronald N. Abernathy, Vista; George H. Wadley, Carlsbad, all of Calif.

[73] Assignee: Asymptotic Technologies, Inc., Carlsbad, Calif.

[21] Appl. No.: 756,447

[22] Filed: Sep. 9, 1991

Related U.S. Application Data

[60] Division of Ser. No. 549,379, Jul. 5, 1990, Pat. No. 5,052,338, which is a continuation-in-part of Ser. No. 472,742, Jan. 31, 1990, abandoned.

[51] Int. Cl.$^5$ .......................... B05C 11/00; B05C 5/00
[52] U.S. Cl. .......................................... 427/8; 427/58; 427/96; 156/356
[58] Field of Search ............... 427/8, 58, 96; 118/664, 118/712, 713, 323, 415, 668; 356/375; 358/101, 107, 227; 156/356, 357, 64; 250/201.4, 561

[56] References Cited

U.S. PATENT DOCUMENTS

| | | | |
|---|---|---|---|
| 4,576,481 | 3/1986 | Hansen | 356/375 |
| 4,661,368 | 4/1987 | Rohde et al. | 118/323 |
| 4,724,480 | 4/1987 | Hecker et al. | 356/375 |
| 4,760,269 | 7/1988 | McKenna | 250/561 |
| 4,762,578 | 8/1988 | Burgin, Jr. et al. | 118/712 |
| 4,814,626 | 3/1989 | Doemens et al. | 356/375 |
| 4,816,861 | 3/1989 | Taniguchi et al. | 250/201.2 |

Primary Examiner—Richard V. Fisher
Assistant Examiner—Todd J. Burns
Attorney, Agent, or Firm—Baker, Maxham, Jester & Meador

[57] ABSTRACT

A method is provided for dispensing viscous materials which first requires the step of providing a dispensing device for holding a quantity of a viscous material to be dispensed through a tip thereof. Next, the dispensing device is coupled to a dispensing control so that a metered amount of viscous material will be dispensed in response to a dispensing control signal. Next, the dispensing device is moved along an axis to selectively position the tip a predetermined distance away from the surface of a workpiece positioned adjacent thereto in response to an applied height control signal. The height control signal is generated by processing output signals from a camera which is moved along the axis with the dispensing device to determine when an image of the workpiece surface is maximally in focus. The final step of the method is to cause the dispensing control to apply the dispensing control signal to cause a metered amount of the viscous material to be dispensed from the tip of the dispensing device onto the workpiece surface.

7 Claims, 3 Drawing Sheets

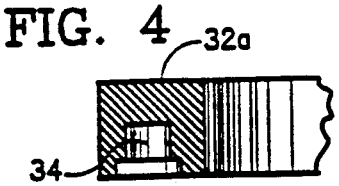
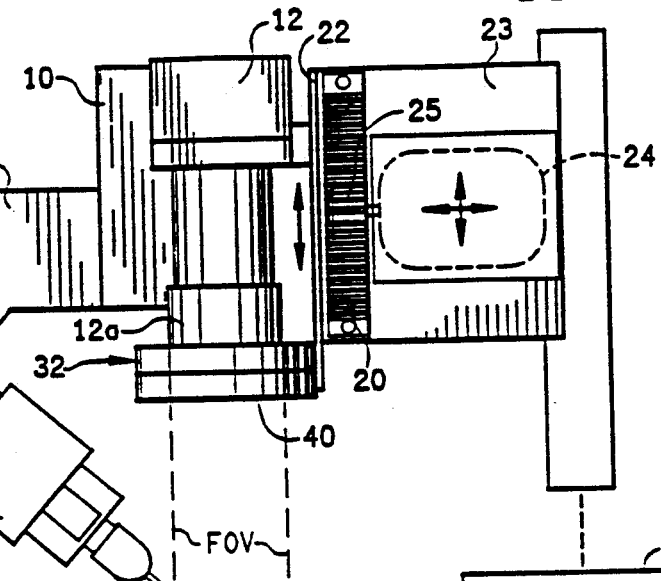
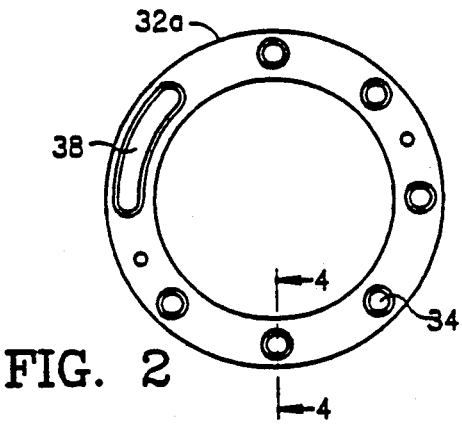
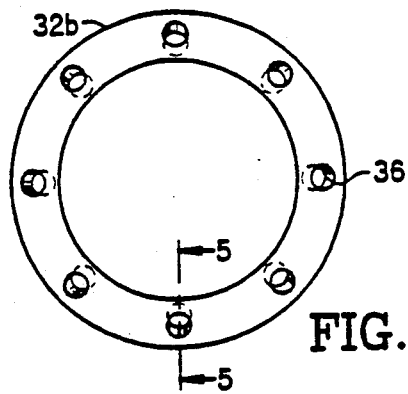
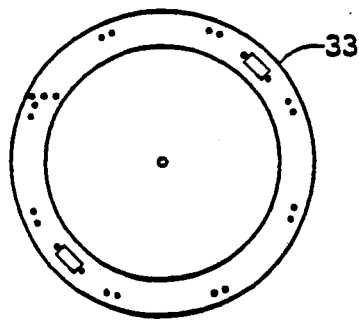
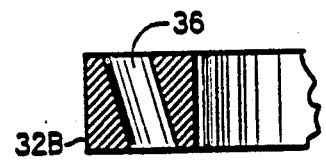

METHOD FOR DISPENSING VISCOUS MATERIALS A CONSTANT HEIGHT ABOVE A WORKPIECE SURFACE

This is a divisional of copending application Ser. No. 07/549,379 filed on Jul. 5, 1990 now U.S. Pat. No. 5,052,338, which is a continuation-in-part of Ser. No. 07/472,742 filed Jan. 31, 1990, abandoned.

BACKGROUND OF THE INVENTION

The present invention relates to a method for dispensing viscous materials, and more particularly, to an automated method for rapid precision dispensing of minute amounts of adhesives, solder paste, and other flowable materials a constant height above the surface of a printed circuit board or other workpiece.

In the manufacture of electronic systems and equipment, it is frequently necessary to apply small amounts of viscous or flowable materials onto circuit boards and other substrates. Such materials may include adhesives, solder paste, epoxy, cyanoacrylates, RTV, silicones, solder mask, surface mount adhesive flux, grease, oil, encapsulants, potting compounds, bonding fluids and inks. These materials are often dispensed from a syringe onto a preselected area. Heretofore this type of dispensing has been done manually for small jobs and repairs. Dispensing control units have been commercially available that pneumatically actuate a syringe under foot pedal control. This approach is too tedious and costly to be used on any significant size of production run.

Automated systems have been sold by ASYMTEK of Carlsbad, Calif. under the trademark AUTOMOVE (400 Series) for dispensing viscous materials. They have consisted of a benchtop X-Y positioner for carrying and guiding a variety of dispensing heads. The motions required may be programmed via an IBM-PC compatible computer. Menu-driven software is provided for programming the desired movements.

ASYMTEK has also sold another automated viscous material dispenser under the trademark DISPENSE-MATE. See U.S. Pat. No. 4,967,933, granted Nov. 6, 1990, having named inventors Philip P. Maiorca et al. Predetermined pattern and fluid flow functions are selected for each of a plurality of consecutive movement elements by operator actuation of corresponding discrete manually actuable switches on a front panel without the need to program with a personal computer. This creates a workpiece program which can be automatically executed on command to dispense the viscous material over the upper surface of a workpiece such as a PC board in the prescribed manner.

In both the AUTOMOVE and DISPENSEMATE viscous material dispensers the height of the tip of the syringe relative to a fixed Z-axis scale may be pre-set prior to the dispensing operation.

In the manufacture of electronic circuit boards, laminated fiberglass PC boards with copper traces and pads are employed to electrically connect the leads of the associated electronic components. These leads are typically attached to the PC board in one of two ways. A first approach is to insert the component lead through a hole in a copper pad and subsequently solder the lead on the other side. This approach is known as the "through-hole" technique. A second approach is to solder the component lead directly to the copper pad without using a pre-drilled hole. This approach is known as the "surface mount" technique. This latter technique requires that a ball of solder paste be applied to the pad. The lead is then pressed into the paste. The components are held in place by the viscosity of the solder paste until the board is heated and the solder paste melts. When the solder solidifies, the component leads are firmly attached to the copper pads and have good electrical continuity therewith.

It is critical to proper attachment and conductivity via the surface mount technique that the solder paste be dispensed at a constant predetermined height above each pad. This ensures the generation of uniform teardrop shaped balls of solder paste. Unfortunately PC boards are frequently warped. In order to compensate for board surface height variations expensive tools can be used to clamp the boards flat. It would be desirable, however, to automatically determine repeatable distances to the workpiece surface at different sites thereon to permit automatic height adjustment of the tip of the syringe prior to each dispensing of viscous material.

U.S. Pat. No. 4,661,368 of Rohde et al. granted Apr. 28, 1987 discloses a dispensing system for flowable materials such as adhesives which is designed to overcome the problems that arise because of height variations due to warpage in a circuit board. The dispensing nozzle tip is advanced into engagement with the particular position on the circuit board to which the material is to be applied. A reactive force on the nozzle tip from the circuit board is sensed by a load cell such that an exact spacing may be provided between the nozzle tip and the particular position on the board to which the material is to be dispensed.

U.S. Pat. No. 3,809,308 of Roeder et al. granted May 7, 1974 discloses a system for maintaining constant distance of a cutting torch from a work piece. A sensing electrode secured to the torch forms a capacitance with the surface portion of the workpiece, and a circuit senses changes in capacitance to adjust the height of the torch.

U.S. Pat. No. 4,762,578 of Burgin, Jr. et al. discloses another device for controlling the spacing between the tip of an adhesive dispenser and the surface of a circuit board. A laser diode and detector are mounted adjacent the tip. While the tip is being advanced, the image reflected off the circuit board moves along the length of the detector and provides an indication of the spacing between the tip and the circuit board.

The foregoing prior art approaches for detecting a predetermined syringe dispensing height have not been entirely satisfactory in commercial applications.

SUMMARY OF THE INVENTION

It is therefore the primary object of the present invention to provide an improved method for rapid precision dispensing of minute amounts of adhesives, solder paste, and other flowable materials at constant height above the surface of a printed circuit board or other workpiece.

According to the present invention, a method is provided for dispensing viscous materials which first requires the step of providing a dispensing device for holding a quantity of a viscous material to be dispensed through a tip thereof. Next, the dispensing device is coupled to a dispensing control so that a metered amount of viscous material will be dispensed in response to a dispensing control signal. Next, the dispensing device is moved along an axis to selectively position the tip a predetermined distance away from the surface of a workpiece positioned adjacent thereto in response to an applied height control signal. The height control signal is generated by processing output signals from a camera which is moved along the axis with the dispensing device to determine when an image of the workpiece surface is maximally in focus. The final step of the method is to cause the dispensing control to apply the dispensing control signal to cause a metered amount of the viscous material to be dispensed from the tip of the dispensing device onto the workpiece surface.

BRIEF DESCRIPTION OF THE DRAWINGS

FIG. 1 is a simplified side elevation view of a of an automated viscous material dispensing apparatus in accordance with a preferred embodiment of our method with a PC board shown in section positioned adjacent thereto.

FIGS. 2 and 3 are enlarged plan views illustrating details of the upper and lower sections of the light ring used in the dispensing apparatus of FIG. 1 to illuminate a portion of the PC board surface.

FIG. 3A is a plan view of a PC board which is positioned between the upper and lower sections of the light ring.

FIG. 4 is an enlarged sectional view of the upper light ring section of FIG. 2 taken along line 4—4 of FIG. 2.

FIG. 5 is an enlarged sectional view of the lower light ring section of FIG. 3 taken along line 5—5 of FIG. 3.

DESCRIPTION OF THE PREFERRED EMBODIMENTS

Figure 6:
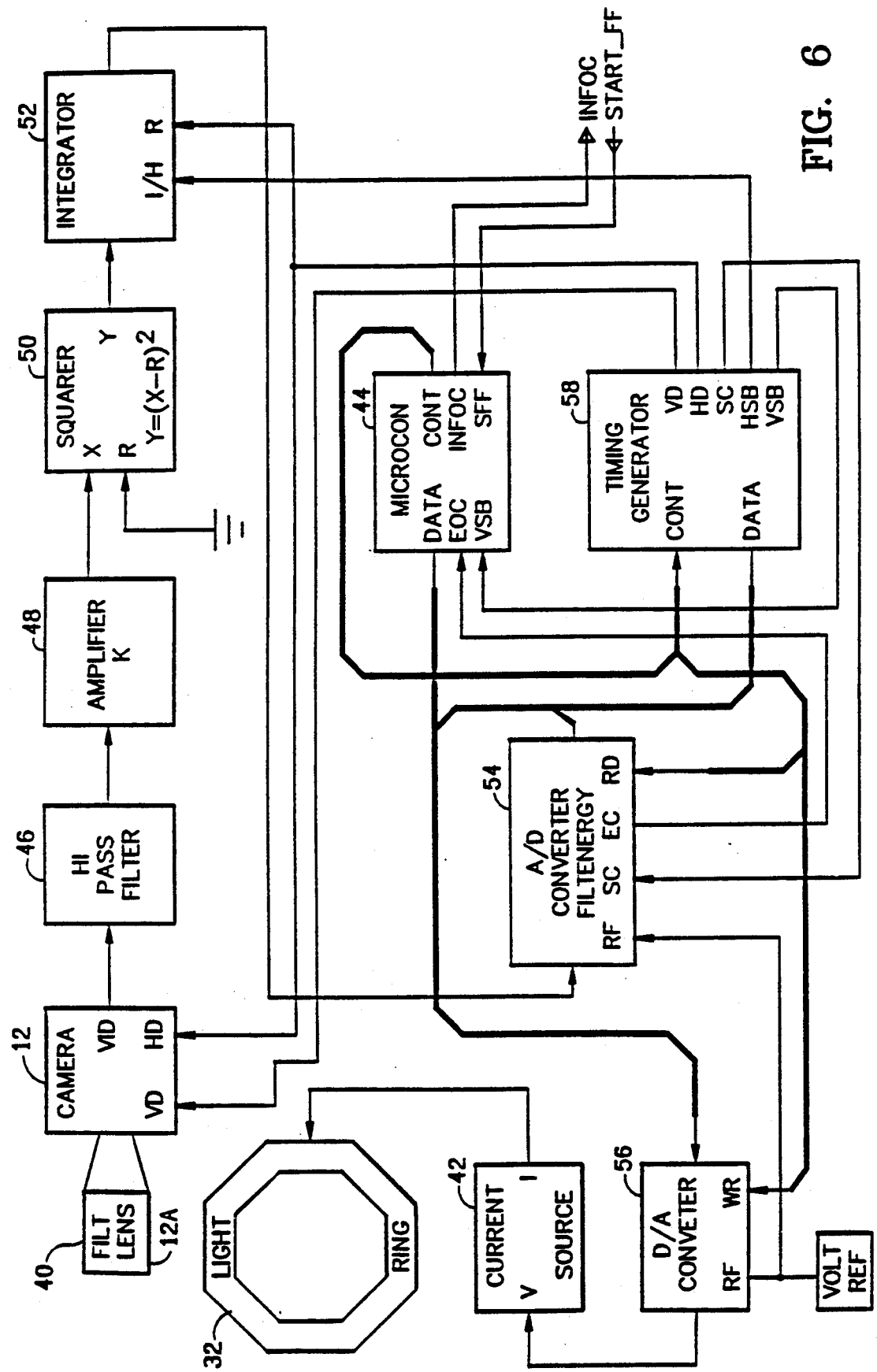
FIG. 6 is a functional block diagram of the electronic portion of the apparatus of FIG. 1.

The entire disclosure of U.S. Pat. No. 4,967,933 granted Nov. 6, 1990 and entitled "Method and Apparatus for Dispensing Viscous Materials" is specifically incorporated herein by reference. Said patent names Philip P. Maiorca et al. as co-inventors.

Referring to FIG. 1, the mechanical portion of an apparatus for performing a preferred embodiment of our method includes a carriage 10 on which is mounted a camera 12. A dispensing device, such as a syringe 14, is also mounted to the carriage 10 at an inclined angle via bracket 16. The syringe 14 is removably received in a holder 18 attached to the bracket. The carriage is supported for movement along a Z axis in response to height control signals. A rack gear 20 is attached to the carriage 10. The carriage can slide vertically by means of a rail assembly 22 attached to the front of a support structure 23. A motor 24 is mounted to the support structure 23. A pinion gear 25 connected to the shaft of the motor 24 meshes with the rack gear 20. The motor 24 may be selectively energized to move the camera and syringe up and down along the Z-axis.

The support structure 23 is mounted to a bench-top or gantry sized X-Y positioner shown diagrammatically at 26 for selective motion along the X and Y axes via energization of corresponding drive motors. Such X-Y positioning mechanism are well known and are commercially available in the AUTOMOVE and DISPENSEMATE products identified above.

The camera 12 (FIG. 1) generates output signals representative of an image of the surface of a workpiece such as a PC board 28 positioned adjacent the camera on platten 30. The camera has a field of view illustrated by the vertical phantom lines labeled "FOV" so that the image of a portion of the PC board surface is converted into output signals representative thereof. Circuitry hereafter described processes the output signals from the camera to determine when the image is maximally in focus and generates the height control signals necessary to maintain the tip of the syringe a predetermined constant height above the surface of PC board. Due to warpage, portions of the PC board may be at a different level as illustrated in exaggerated fashion by the horizontal phantom lines 28' in FIG. 1. Thus before solder paste, adhesive or other viscous material is dispensed onto a particular area of the PC board the height thereof is sensed and the height of the syringe is adjusted.

One suitable commercially available camera is the PULNIX Model TM540R. It includes a charge coupled device (CCD) which is used as the light sensor. This camera generates output signals representative of the surface of the PC board that is in the field of view. The dispensing tip 14a (FIG. 1) of the syringe is preferably positioned at the geometric center of the field of view of the camera 12. The presence of the needle in the field of view of the camera does not significantly affect the performance of the system due to the algorithm and hardware design hereafter described. The X-Y positioner 26 is energized to move the tip 14a to the center of the surface portion of interest. The vertical position of the tip 14a is then changed by moving the carriage 10 up or down along the Z axis until the surface 28 is maximally in focus. The viscous material is thereafter dispensed.

The syringe 14 or other suitable dispensing device is connectable to a valving device (not illustrated). This device may be a commercially available pneumatic dispensing control unit (DCU), an electrical valving device or some other suitable means. A quantity of the viscous fluid is contained within the barrel of the syringe and is ejected from the tip 14a upon actuation of an appropriate pneumatic or electrically controlled valve.

A light ring 32 (FIG. 1) surrounds the lens portion 12a of the camera for illuminating the portion of the PC board surface in the field of view. The light ring is formed of two mating cylindrical ring sections 32a and 32b illustrated in FIGS. 2 and 3 which sandwich a ring-shaped PC board 33 illustrated in FIG. 3A. The bottom side of the top ring 32a is illustrated in FIG. 2. The bottom side of the bottom ring 32b is illustrated in FIG. 3. These rings may be formed of a suitable plastic such as DELRIN.

The upper ring section 32a (FIG. 2) has a plurality of circumferentially spaced stepped cylindrical recesses 34 (FIG. 4) for receiving the wiring of corresponding light emitting diodes (LEDs) therein which are not illustrated. These LEDs are mounted to the ring-shaped PC board 33. The lower ring section 32b (FIG. 3) has a plurality of circumferentially spaced holes 36 (FIG. 5) which converge toward each other at an angle of sixteen degrees to direct the light over the region of the workpiece PC board surface 28 generally confined within the field of view of the camera 12. An elongate recess 38 (FIG. 2) in the upper ring section 32a is provided for attaching a wiring harness (not illustrated) to the ring-shaped PC board and strain relieving the same. Once the LEDs and related circuitry are installed and connected the ring sections may be held together by screws not shown.

Preferably the LEDs in the light ring 32 are high intensity LEDs. Typically such LEDs emit red light. An ancillary benefit is thereby achieved since the CCD in the camera is most receptive or sensitive to light having this wavelength. It is desirable that fluctuations in the ambient light level in the work area not affect the accuracy of the auto-height determination. This can be accomplished by illuminating the field of view with high intensity light supplied by the LEDs.

It is desirable to attenuate the light reflected off the PC board to the camera with an optical filter 40 (FIG. 6). In order to reduce the sensitivity of the apparatus to ambient light fluctuations, the high intensity LEDs and the filter 40 are operatively coupled to the lower end of the lens portion 12a of the camera. This ensures that the CCD is not saturated by the high intensity LEDs.

The LEDs are preferably mounted in a circular pattern and angled in a converging manner, e.g. at sixteen degrees, so that their illumination spots all overlap on the PC board surface at the center of focus of the camera, within the field of view. This arrangement eliminates shadows. Preferably the LEDs are energized with a voltage controlled current source 42 (FIG. 6) to minimize fluctuation in their level of illumination.

The lens portion 12a of the camera is normally employed to bring an image into focus. Since the focal length is fixed, when the image is in focus, there will be a fixed known distance between the image sensor (CCD) and the surface of the work piece (PC board). When an object is in focus, the edges of the object appear to be sharp. When the object is out of focus, the edges appear to be blurred. The spatial Fourier transform of an image indicates that when the image is in focus, the high frequency energy is at its peak.

Spatially, the incoming light reflected off the surface of the work piece is focused onto the CCD. This image sensor is divided into a grid. Each element of the grid is called a pixel. This grid has m rows, and n columns. In the time domain, each pixel integrates the light impinging on its surface for a period of time. This is called the shutter time. In the period between the closure of the shutter and the opening of the shutter, two things must happen. First the data in the image sensor must be transferred to the output, and second the image sensor must be reset to allow integration of the next frame. The shutter time plus the transfer time plus the reset time equals the field time.

The usual method of transmitting video information in the United States is demoninated by the EIA-170 standard. The video is split between frames, fields, and data packets. There are 29.97 frames per second. There are two fields per frame, and 262.5 data packets per field. Data packets are 63.56usec long.

In order for the human eye to see without flicker, image data must be updated at least twenty-five frames per second. In order to achieve acceptable resolution, 484 lines were chosen. The electronic technology available when video was originally created was limited. Therefore engineers decided to split frames into two fields. Even data packets were sent in one field and odd data packets were sent in another field. This cut the bandwidth needed by half, but still prevented flicker.

Of the 525 data packets available, thirty-two are used for vertical blanking, and vertical reset. The remaining 493 data packets are used for transmitting data. They are referred to hereafter as packets 1 through 493. Packets 1 through 7, the first half of packet 8, and the last half of packet 493 are used for other purposes besides video e.g. close captioning for the hearing impaired. The last half of packet 8, packets 9 through 492, and the first half of packet 493 contain the image data. The last half of row 1 of the image sensor is mapped into the last half of packet 8. Rows 2 through 485 of the image sensor are mapped into packets 9 through 492. The first half of row 486 of the image sensor is mapped into the first half of packet 493. This gives 484 whole lines, with a half line on top, and a half line on the bottom.

The video signal starts with sixteen packets of vertical blanking and vertical sync. After that, 246.5 odd packets follow. Then another sixteen packets of vertical blanking and vertical sync follow. Then 246.5 even data packets follow.

The focal theory of our invention can now be described. If one calculates the double integral over a search box of the partial derivative of the image with respect to X squared plus the partial derivative of the image with respect to Y squared, the result is the value F which is an indicator of how "in focus" the image is. See Equation I listed below.

$$F = \int_{Y_1}^{Y_2} \int_{X_1}^{X_2} \left[ \left( \frac{dv(X,Y)}{dx} \right)^2 + \left( \frac{dv(X,Y)}{dy} \right)^2 \right] dx dy$$

The search box is a rectangular area of the image sensor which the foregoing calculation is applied to. The dispensing syringe may be positioned in accordance with the following procedure. The camera is initially located above the focal plane and the value F is calculated using Equation I. The camera is then moved one step closer to the surface of the PC Board and the value F is calculated again. This new value of F is compared with the previous value of F. If the current value is greater than the previous value of F, then the camera is moved one step closer to the PC Board, and F is calculated again. This process is repeated until the current value of F is lower than the previous value. Once this occurs, the focal plane has been located.

In order to carry out the calculations required by equation I with digital circuitry, the derivatives and integrals become the difference equations and summations indicated in Equation II below.

$$F = \sum_{Y=Y_1}^{Y_2} \sum_{X=X_1}^{X_2} \{[v(X,Y) - v(X-1,Y)]^2 +$$

$$[v(X,Y) - v(X,Y-1)]^2\}$$

In order to achieve a vertical gradient, the image must be digitized. When only the horizontal gradient is operated upon, it is only necessary to hi-pass the video, square it, and integrate on a line by line basis. At the end of each line the result is passed through an analog to digital converter and accumulated by a microcontroller 44 (FIG. 6). See Equation III set forth below.

$$F = \sum_{TSB}^{BSB} \int_{LSB}^{RSB} \left( \frac{dv}{dx} \cdot \frac{dx}{dt} \right)^2 dt = \sum_{TSB}^{BSB} \int_{LSB}^{RSB} \left[ \frac{dv(t)}{dt} \right]^2 dt$$

Where BSB refers to the bottom search box, TSB refers to the top search box, LSB refers to the left search box and RSB refers to the right search box.

The differentiator may be a third order or higher hi-pass Butterworth filter, with a cutoff frequency of about 1000 kHz. A gain stage may be added after the filter to optimize the signal-to-noise ratio of the analog multiplier.

Referring to the block diagram of FIG. 6, light enters the lens of the camera 12. The camera outputs signals whose voltages are proportional to the light intensity at the CCD image sensor in accordance with the EIA-170 standard. The camera is synchronized to the focal find electronic circuitry by use of a horizontal and vertical drive. The video signal is transmitted through a high pass filter 46, through an amplifier 48 having gain K and then through a squaring circuit 50. The voltage of the video signal at this point is proportional to the instantaneous hi-frequency power. This signal is then integrated through integrator circuit 52 over time in order to derive the energy. This signal is then passed to the inputs of an A/D convertor 54. The output signal of the A/D convertor is then transmitted to the microcontroller 44. The apparatus of FIGS. 1-6 which may be utilized to carry out the preferred embodiment of our method includes a programmable search box. This allows the user to choose what area of the image to operate on. This is a necessity in dispensing applications. For example, if the user is dispensing solder paste, and there are several pads in the field of use, previously dispensed solder paste would interfere with the execution of the focal find equation. The microcontroller 44 can control the size of the search box. The search box has four parameters, namely: LSB (left search box), RSB (right search box), TSB (top search box), and BSB (bottom search box). The LSB and RSB control the INTEGRATE/HOLD signal, which in turn controls the integration time. At the end of each line the signal is converted, and the integrator is reset. The TSB and BSB control the VSB signal, which informs the microcontroller when to accumulate horizontal line energies.

In order for Equation III to be an accurate indicator of when the image is in focus, it is necessary for the surface of the workpiece which is within the field of view to be subjected to constant, uniform illumination. This is achieved by use of the light ring 32 as previously indicated. The intensity of the LEDs may be controlled by a D/A convertor 56 which is connected to the microcontroller.

Figure 7:
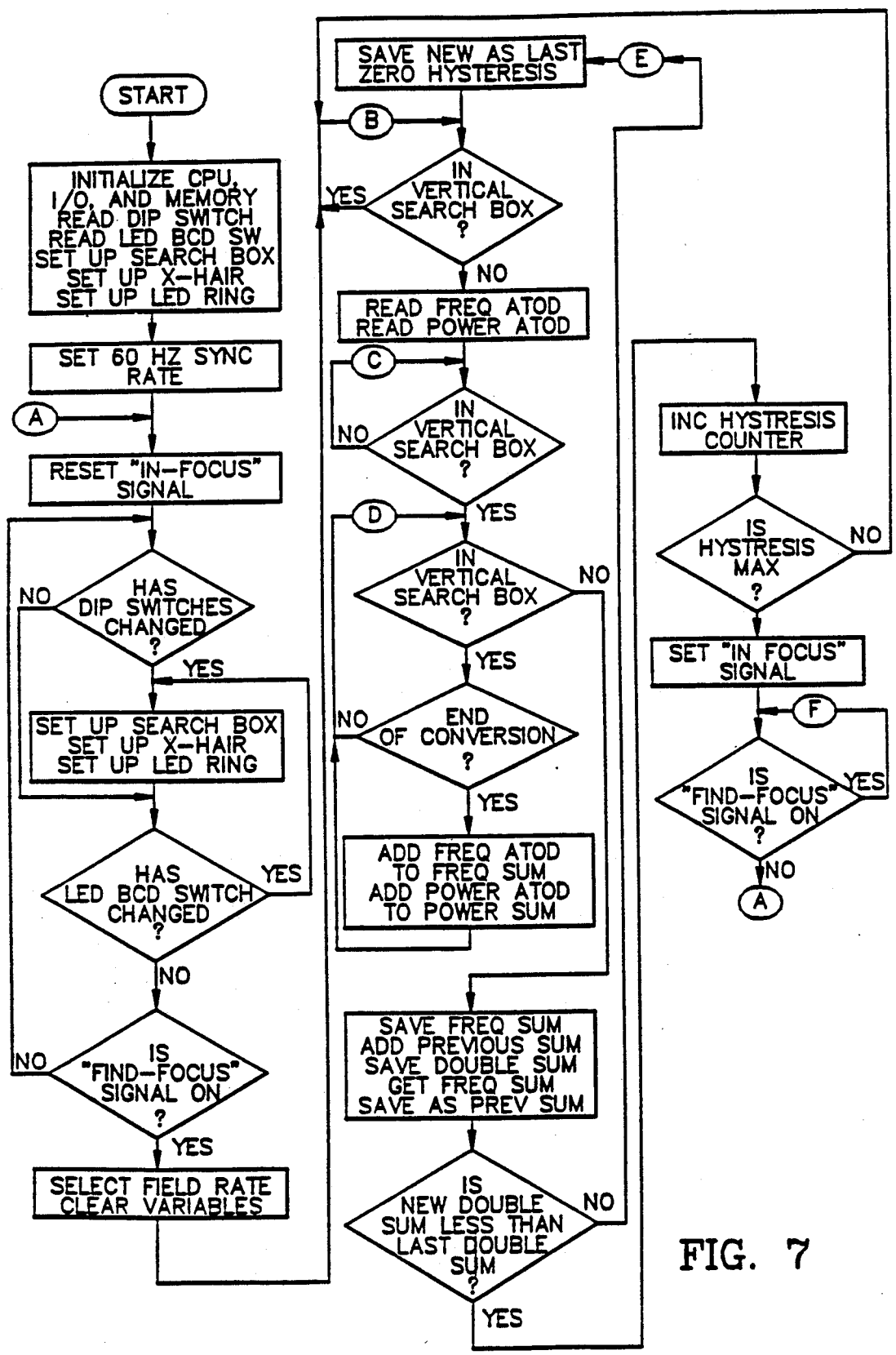
FIG. 7 is a flow diagram of the logic performed by the electronic portion of the apparatus illustrated in FIG. 1.

The microcontroller 44 maintains several variables. This will be better understood by reading the following description in conjunction with the flow diagram of FIG. 7.

FILT_SUM: filtered energy accumulator for the current field
PR_FL_FD: filtered energy from previous field
PR_FL_FR: filtered energy from previous frame
TEMP: temporary variable After initialization the microcontroller waits until it receives a "FIND_FOCUS" signal from the host. It then clear its variables and tests for VSB (vertical search box). If in the VSB the firmware loops to label "B" until the VSB ends to avoid processing a partial field. The firmware then tests for entering the VSB from the top by looping at label "C". VSB is tested at label "D". If VSB is still true EOC (End Of Conversion) is tested. If EOC is true then filtered energy is read from the A/D convertor and added to FILT_SUM. The program loops to label "D" until VSB is false (bottom of search box). FILT_SUM is saved in TEMP then PR_FL_FD is added to FILT_SUM. TEMP is stored as PR_FL_FD. FILT_SUM is compared to PR_FL_FR. If FILT_SUM is not less than PR_FL_FR the program branches to "E" and saves FILT_SUM as a new PR_FL_FR. If FILT_SUM is less than PR_FL_FR for all hysteresis steps the microcontroller asserts the "IN_FOCUS" signal. The firmware then loops at "F" until the "FIND_FOCUS" signal is turned off by the machine. The firmware then brances to "A", resets the "IN_FOCUS" signal, and waits for the next "FIND_FOCUS" signal.

While we have described preferred embodiment of our method for dispensing viscous materials a constant height above the surface of a printed circuit board or other workpiece, it should be understood that modifications and adaptations of this embodiment will occur to persons skilled in the art. Therefore, the protection afforded our invention should only be limited in accordance with the scope of the following claims.

We claim:

1. A method for dispensing viscous materials, comprising the steps of:
    providing a dispensing device for holding a quantity of a viscous material to be dispensed through a tip thereof;
    coupling the dispensing device to a dispensing control so that a metered amount of the viscous material will be dispensed in response to a dispensing control signal;
    moving the dispensing device along an axis to selectively position the tip a predetermined distance away from the surface of a workpiece positioned adjacent thereto in response to an applied height control signal, said height control signal being generated by processing the output signals from a camera moved along with the dispensing device to determine when an image of the workpiece surface is maximally in focus; and
    causing the dispensing control to apply the dispensing control signal to cause a metered amount of the viscous material to be dispensed from the tip of the dispensing device onto the workpiece surface.

2. A method according to claim 1 wherein the height control signal is generated by processing the output signals from the camera to divide the image of the workpiece into a plurality of search boxes.

3. A method according to claim 2 wherein the height control signal is generated by processing the output signals from the camera by calculating a value F for a given image at a preselected position of the camera along the axis of the movement according to the double integral over a search box of the partial derivative of the image with respect to an X axis squared plus the partial derivative of the image with respect to a Y axis squared.

4. A method according to claim 3 wherein the processing of the output signals from the camera further includes a step of calculating a succession of values of F for successive positions of the camera along the axis until the value of F is lower than the previous value.

5. A method according to claim 1 wherein the height control signal is generated by processing the output signals from the camera by calculating a value F for a given image at a preselected position of the camera along the axis of movement according to $$F = \sum_{Y=Y_1}^{Y_2} \sum_{X=X_1}^{X_2} \{[v(X,Y) - v(X-1,Y)]^2 +$$

$$[v(X,Y) - v(X,Y-1)]^2\}$$

wherein
$X_1, X_2 = $ X axis range of the search box, and
$Y_1, Y_2 = $ Y axis range of the search box.

6. A method according to claim 5 wherein the processing of the output signals from the camera further includes the step of calculating:

$$F = \sum_{TSB}^{BSB} \int_{LSB}^{RSB} \left[ \frac{dv(t)}{dt} \right]^2 dt$$

wherein
t = time,
TSB = the top search box,
BSB = the bottom search box,
RSB = the right search box, and
LSB = the left search box.

7. A method for dispensing viscous materials onto a generally planar workpiece having an upper surface with height variations, comprising the steps of:
 providing a dispensing device for holding a quantity of viscous material to be dispensed through a tip thereof;
 coupling the dispensing device to a dispensing control so that metered amount of the viscous material will be dispensed in response to a dispensing control signal;
 supporting the dispensing device for independent movement of the tip thereof along an X axis, a Y axis and a Z axis;
 positioning the workpiece in a X-Y plane beneath the tip of the dispensing device;
 moving the dispensing device along an X and Y axis to selectively position the tip above a predetermined location on the upper surface of the workpiece where viscous material is to be deposited;
 moving the dispensing device along the Z axis to position the dispensing tip a predetermined height above the upper surface of the workpiece at the predetermined location in response to an applied height control signal, said height control signal being generated by processing the output signals from a camera moved along with the dispensing device to determine when an image of the workpiece surface is maximally in focus; and
 causing the dispensing control to apply the dispensing control signal to cause a metered amount of the viscous material to be dispensed from the tip of the dispensing device onto the predetermined location on the upper surface of the workpiece.

* * * * *